(12) United States Patent
Feng et al.

(10) Patent No.: US 10,425,085 B2
(45) Date of Patent: Sep. 24, 2019

(54) CRYSTAL OSCILLATOR CIRCUIT

(71) Applicants: Semiconductor Manufacturing International (Shanghai) Corporation, Shanghai (CN); Semiconductor Manufacturing International (Beijing) Corporation, Beijing (CN)

(72) Inventors: Er Yuan Feng, Shanghai (CN); Zhen Jiang Su, Shanghai (CN); Zhen Ye Guo, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 213 days.

(21) Appl. No.: 15/436,892

(22) Filed: Feb. 20, 2017

(65) Prior Publication Data
US 2017/0288680 A1   Oct. 5, 2017

(30) Foreign Application Priority Data

Mar. 30, 2016   (CN) .......................... 2016 1 0192685

(51) Int. Cl.
*H03L 3/00* (2006.01)
*H03L 7/093* (2006.01)
(Continued)

(52) U.S. Cl.
CPC ................ *H03L 3/00* (2013.01); *H03B 5/06* (2013.01); *H03B 5/32* (2013.01); *H03B 5/364* (2013.01);
(Continued)

(58) Field of Classification Search
CPC .. H03L 3/00; H03L 7/093; H03B 5/32; H03B 2200/0082; H03B 5/364; H03K 19/20
(Continued)

(56) References Cited

U.S. PATENT DOCUMENTS 4,956,618 A  * 9/1990 Ulmer .................... H03B 5/364
                                                331/108 A
6,329,884 B1   12/2001 Tsukagoshi et al.
2006/0071729 A1   4/2006 Cetin et al.

FOREIGN PATENT DOCUMENTS

JP        H11127032 A    5/1999

OTHER PUBLICATIONS

The European Patent Office (EPO) The Extended European Search Report for 17162366.3 dated Sep. 4, 2017 9 Pages.

* cited by examiner

*Primary Examiner* — Arnold M Kinkead
(74) *Attorney, Agent, or Firm* — Anova Law Group, PLLC

(57) ABSTRACT

A crystal oscillator circuit is provided. The crystal oscillator circuit includes an oscillator start-up circuit having a first output terminal and a second output terminal, where the second output terminal outputs a first oscillation signal; and a waveform conversion circuit configured to convert the first oscillation signal to a rectangular wave signal. The crystal oscillator circuit also includes a first current source configured to output a first current to drive the oscillator start-up circuit; and a second current source configured to output a second current, and being connected in parallel with the first current source to jointly drive the oscillator start-up circuit. Further the crystal oscillator circuit includes a pulse generation circuit configured to generate a control pulse signal
(Continued)

Figure 3 to control the second current source to output the second current after power on and to stop outputting the second current after a preset time.

19 Claims, 3 Drawing Sheets

(51) Int. Cl.
  *H03K 19/20* (2006.01)
  *H03B 5/32* (2006.01)
  *H03B 5/06* (2006.01)
  *H03B 5/36* (2006.01)
(52) U.S. Cl.
  CPC ............. *H03K 19/20* (2013.01); *H03L 7/093* (2013.01); *H03B 2200/0082* (2013.01); *H03B 2200/0094* (2013.01)
(58) Field of Classification Search
  USPC .................................... 331/158, 116 FE, 185
  See application file for complete search history.

US 10,425,085 B2

CRYSTAL OSCILLATOR CIRCUIT

CROSS-REFERENCES TO RELATED APPLICATIONS

This application claims the priority of Chinese patent application No. 201610192685.3, filed on Mar. 30, 2016, the entirety of which is incorporated herein by reference.

FIELD OF THE INVENTION

The present invention generally relates to the field of electronic technology and, more particularly, relates to a crystal oscillator circuit.

BACKGROUND

A crystal oscillator is referred to as a crystal, and is a type of high-precision and high-stability oscillator. In electronic circuit applications, it can cooperate with other components to generate a standard pulse signal with specific oscillation frequency as a clock signal or to provide a reference signal for a specific system.

For the crystal oscillator circuit, too-long start-up time is one of the ever-present problems. From the view point of magnitude, the low-frequency crystal oscillator circuit takes about several hundred milliseconds or a few seconds of the start-up time to start, which is far slower than the high-frequency crystal oscillator circuit. In the crystal oscillator circuit, one of the factors causing a long start-up time may be the low loop-gain of the crystal oscillator circuit.

FIG. 1 is an existing crystal oscillator circuit. As shown in FIG. 1, the existing crystal oscillator circuit 100 is a type of crystal oscillator circuit with low-power consumption, and includes: an oscillator start-up circuit (not labeled) containing a crystal oscillator XTAL, a first load capacitor C1, a second load capacitor C2, and an inverter INV. A first output terminal and a second output terminal of the crystal oscillator XTAL are respectively connected to a first output terminal and a second output terminal of the oscillator start-up circuit. A first terminal of the first load capacitor C1 is connected to the first output terminal of the oscillator start-up circuit, and a second terminal of the first load capacitor C1 is grounded.

A first terminal of the second load capacitor C2 is connected to the second output terminal of the oscillator start-up circuit, and a second terminal of the second load capacitor C2 is grounded. An input terminal and an output terminal of the inverter INV are respectively connected to the first output terminal and the second output terminal of the oscillator start-up circuit. The crystal oscillator circuit 100 also includes a first current source I1 for outputting a first current to drive the oscillator start-up circuit. Further, the crystal oscillator circuit 100 includes a cascade of at least one buffer (BUF, FIG. 1 only illustrates one BUF) for converting a first oscillation signal to a rectangular wave signal and outputting the rectangular wave signal.

However, such crystal oscillator circuit 100 often faces an issue of too-long start-up time. The disclosed device structures and methods are directed to solve one or more problems set forth above and other problems.

BRIEF SUMMARY OF THE DISCLOSURE

One aspect of the present disclosure includes a crystal oscillator circuit. The crystal oscillator circuit includes an oscillator start-up circuit having a first output terminal and a second output terminal, wherein the second output terminal outputs a first oscillation signal; and a waveform conversion circuit configured to convert the first oscillation signal to a rectangular wave signal. The crystal oscillator circuit also includes a first current source configured to output a first current to drive the oscillator start-up circuit; and a second current source configured to output a second current, and being connected in parallel with the first current source to jointly drive the oscillator start-up circuit. Further the crystal oscillator circuit includes a pulse generation circuit configured to generate a control pulse signal to control the second current source to output the second current after power on and to stop outputting the second current after a preset time.

Another aspect of the present disclosure includes a method for driving a crystal oscillator circuit. The method includes providing an oscillator start-up circuit having a first output terminal and a second output terminal. The method also includes providing a first current source configured to output a first current; and providing a second current source configured to output a second current. In addition, the method includes proving a pulse generation circuit configured to generate a control pulse signal to control the second current source to output the second current after power on and to stop outputting the second current after a preset time. Moreover, the method includes making the second current source be in parallel with the first current source to jointly drive the oscillator start-up circuit, to increase the ability to drive the oscillator start-up circuit without changing the loop-gain of the crystal oscillator circuit and to decrease the start-up time of the crystal oscillator circuit. Further, the method includes making the second current source only operate for the preset time when the crystal oscillator circuit is turned on, to reduce the start-up time of circuit, at the same time, to ensure the low-power consumption characteristic of the circuit.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

Figure 1:
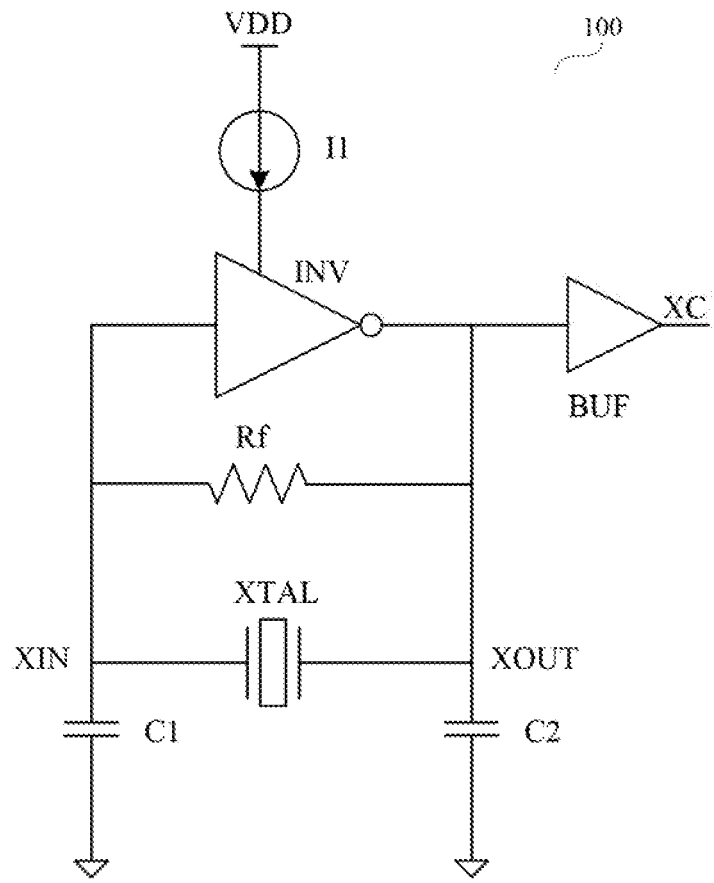
FIG. 1 illustrates an existing crystal oscillator circuit.
Figure 2:
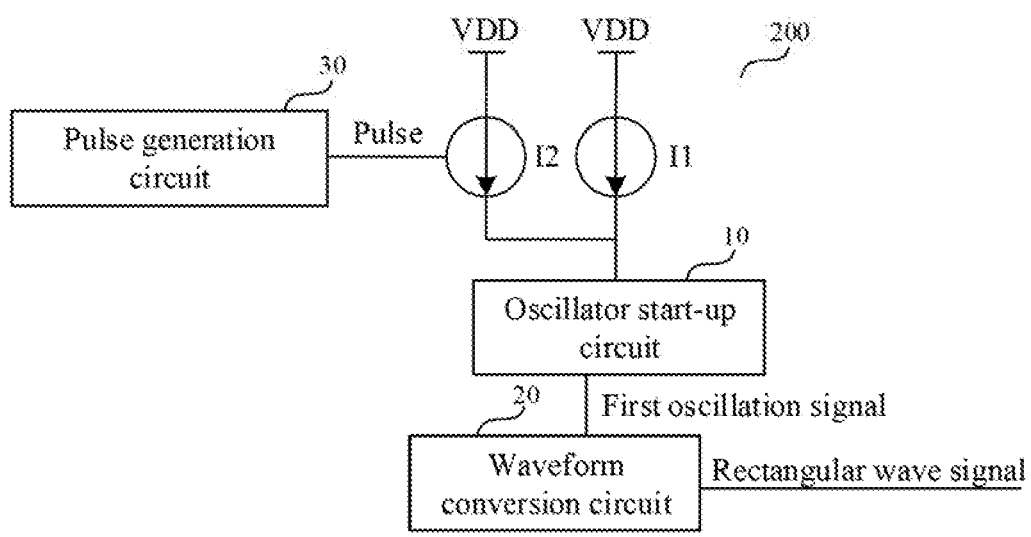
FIG. 2 illustrates a crystal oscillator circuit consistent with the disclosed embodiments.

FIG. 2 illustrates a crystal oscillator circuit consistent with the disclosed embodiments. As shown in FIG. 2, the crystal oscillator circuit 200 may include an oscillator start-up circuit 10 having a first output terminal and a second output terminal, where the second output terminal may output a first oscillation signal. The first oscillation signal may be a sinusoidal signal, and other signals may also be used.

The crystal oscillator circuit 200 may also include a waveform conversion circuit 20, a first current source I1, and a second current source I2. The waveform conversion circuit 20 may be configured to convert the first oscillation signal to a rectangular wave signal. The first current source I1 may be configured to output a first current to drive the oscillator start-up circuit 10. The second current source I2 may be configured to output a second current and be in parallel with the first current source I1 to jointly drive the oscillator start-up circuit 10.

Further, the crystal oscillator circuit 200 may include a pulse generation circuit 30. The pulse generation circuit 30 may be configured to generate a control pulse signal, to control the second current source I2 to output the second current after power on and to stop outputting the second current after a preset time.

In one embodiment, the first current source I1 and the second current source I2 may jointly drive the oscillator start-up circuit 10, such that the ability to drive the oscillator start-up circuit 10 may be increased without changing the loop-gain of the crystal oscillator circuit 200, so as to decrease the start-up time of the crystal oscillator circuit 200. Thus, the pulse generation circuit 30 may be equivalent to a type of pre charging circuit. When a power supply VDD supplies power, a pulse signal may be generated to control the opening or closing of the second current source I2. When the pre-charging circuit begins to operate, the output current of the second current source I2 may be large, such that the crystal oscillator circuit 200 can be quickly established. When the crystal oscillator circuit 200 enters into the normal operating state, the pulse generation circuit 30 may be turned off, and the output current of the second current source I2 may be turned off. Therefore, the current consumption in the circuit may not continue to increase, ensuring the low-power consumption characteristic of the crystal oscillator circuit 200.

Figure 3:
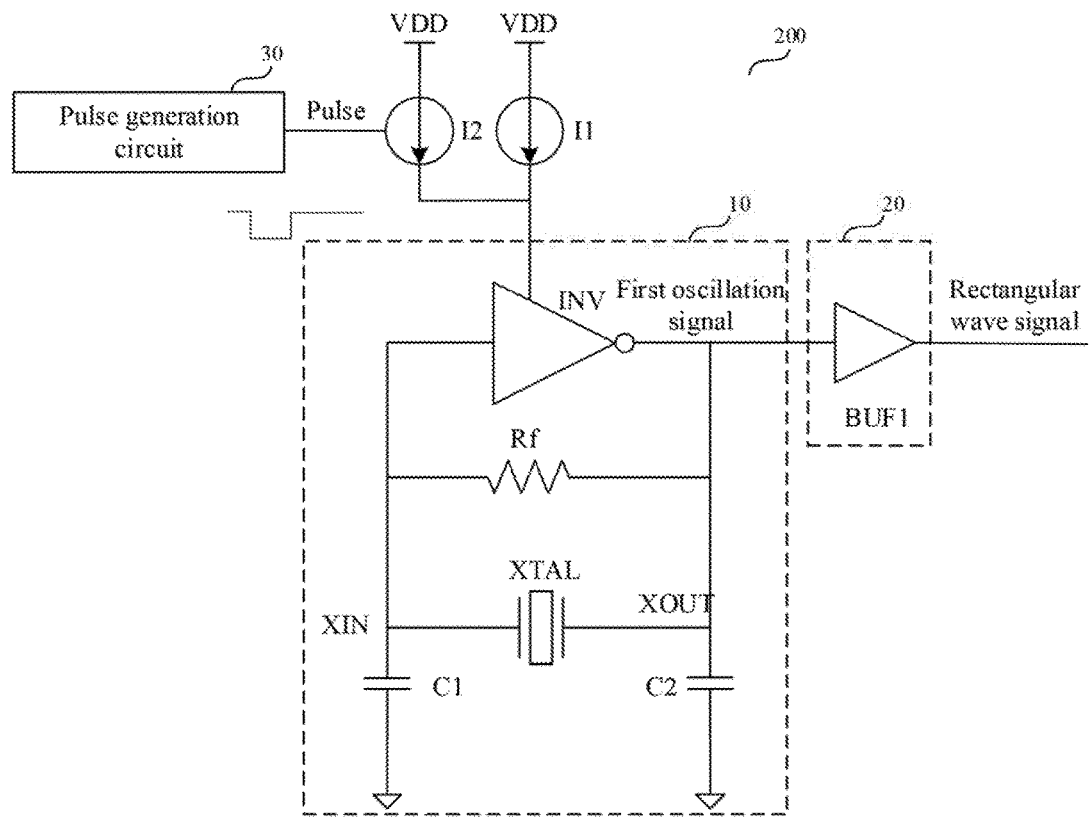
FIG. 3 illustrates another crystal oscillator circuit consistent with the disclosed embodiments.

In one embodiment, the waveform conversion circuit 20 may include a cascade of at least one buffer BUF1, and FIG. 3 illustrates one level of BUF1.

FIG. 3 illustrates another crystal oscillator circuit consistent with the disclosed embodiments. As shown in FIG. 3, the oscillator start-up circuit 10 may include a crystal oscillator XTAL, a first load capacitor C1, a second load capacitor C2, and an inverter INV. A first output terminal and a second output terminal of the crystal oscillator XTAL may be respectively connected to a first output terminal and a second output terminal of the oscillator start-up circuit 10.

A first terminal of the first load capacitor C1 may be connected to the first output terminal of the oscillator start-up circuit 10, and a second terminal of the first load capacitor C1 may be grounded. A first terminal of the second load capacitor C2 may be connected to the second output terminal of the oscillator start-up circuit 10, and a second terminal of the second load capacitor C2 may be grounded. An input terminal and an output terminal of the inverter INV may be respectively connected to the first output terminal and the second output terminal of the oscillator start-up circuit 10.

In one embodiment, the oscillator start-up circuit 10 may be a parallel resonant oscillation start-up circuit 10. The oscillator may be electrically equivalent to a two terminal network with a capacitor and a resistor in parallel, and with another capacitor in series. The two terminal network may have two resonant points, according to the high and low frequencies of the resonant points to distinguish, the low frequency may correspond to a series resonance, and the high frequency may correspond to a parallel resonance.

Because of characteristics of the crystal itself, the two frequencies may be close to each other. In such very narrow frequency range, the oscillator may be equivalent to an inductor, such that it can form a parallel resonant circuit when the two terminals of the oscillator are connected in parallel with the appropriate capacitors. In certain other embodiments, the oscillator start-up circuit 10 may also be suitable to form a series resonant circuit.

Figure 4:
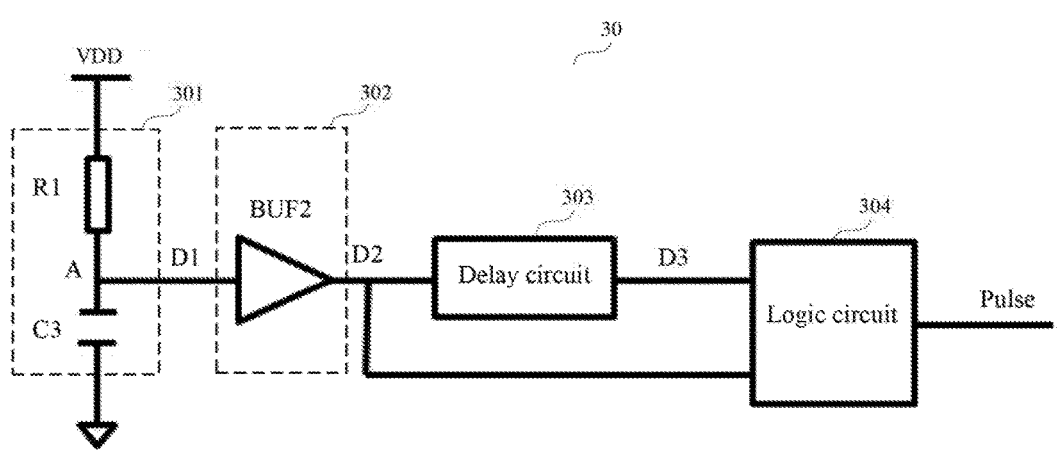
FIG. 4 illustrates a pulse generation circuit consistent with the disclosed embodiments.
Figure 5:
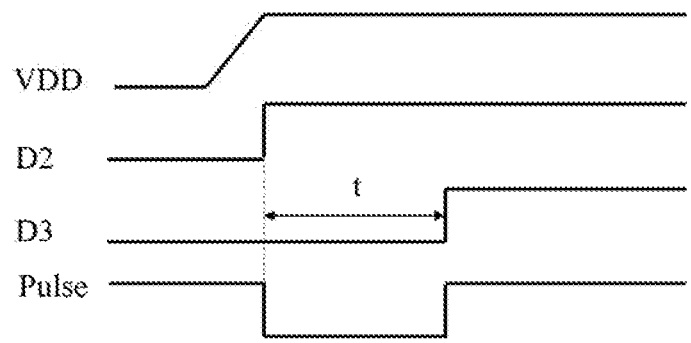
FIG. 5 illustrates waveform diagrams of a power supply VDD, a second pulse signal D2, a third pulse signal D3, and a control pulse signal Pulse consistent with the disclosed embodiments.

FIG. 4 illustrates the pulse generation circuit 30 consistent with the disclosed embodiments. FIG. 5 illustrates waveform diagrams of a power supply VDD, a second pulse signal D2, a third pulse signal D3, and a control pulse signal Pulse in the pulse generation circuit 30 shown in FIG. 4.

Referring to FIG. 4 and FIG. 5, in one embodiment, the pulse generation circuit 30 may include a charging circuit 301 having a charging node A, an edge adjustment circuit 302, a delay circuit 303, and a logic circuit 304. When the power is turned on, the power supply VDD may charge the charging circuit 301, and the charging node A may output a first pulse signal D1.

The edge adjustment circuit 302 may be configured to improve the edge sharpness of the first pulse signal D1, to output a second pulse signal D2. The delay circuit 303 may be configured to delay the second pulse signal D2 with a delay time of t, to output a third pulse signal D3. The logic circuit 304 may be configured to perform a logic operation onto the second pulse signal D2 and the third pulse signal D3, to output a control pulse signal Pulse.

When the supply power VDD is turned on, the charging circuit 301 may be charged, and the first pulse signal D1 outputted from the charging node A may be changed from low level to high level. After passing the edge adjustment circuit 302, the edge sharpness of the second pulse signal D2 may be increased. Under the role of the logic circuit 304, the effective level of the control pulse signal Pulse may be low level. Under the role of the low level for a preset time, the second current source I2 may output the second current. When the control pulse signal Pulse becomes high level, the second current source I2 may stop outputting the second current.

In one embodiment, the charging circuit 301 may include a first resistor R1 and a third capacitor C3. A first terminal of the first resistor R1 may be connected to the power supply VDD. A second terminal of the first resistor R1 may be connected to a first terminal of the third capacitor C3 and connected to the charging node A. A second terminal of the third capacitor C3 may be grounded. In one embodiment, the edge adjustment circuit 302 may include a cascade of at least one buffer BUF2.

In one embodiment, to ensure the level logic of the pulse generation circuit 30, the delay circuit 303 may include even number of cascaded inverters. However, the delay circuit 303 may also include odd number of cascaded inverters, and correspondingly adjustments in the design of the logic circuit may be performed. Other types of the delay circuit 303 may also be used.

The logic circuit 304 may be an AND gate. A first input terminal and a second input terminal of the AND gate may respectively input the second pulse signal D2 and the third pulse signal D3, and an output terminal of the AND gate may output the control pulse signal Pulse. The logic circuit 304 can also be realized by a combination of any digital logic circuit 304.

In one embodiment, the inverter INV may include a first PMOS transistor and a first NMOS transistor. A gate of the first PMOS transistor may be connected to a gate of the first NMOS transistor and connected to the input terminal of the inverter INV. A drain of the first PMOS transistor may be connected to a drain of the first NMOS transistor and connected to the output terminal of the inverter INV. A source of the first NMOS transistor may be grounded. A source of the first PMOS transistor may be connected to an output terminal of the first current source I1 and the second current source I2.

In one embodiment, the second current source I2 may include a second PMOS transistor (not labeled). A source of the second PMOS transistor may be connected to the power supply VDD. A gate of the second PMOS transistor may input the control pulse signal Pulse. A drain of the second PMOS transistor may be as the output terminal of the second current source I2.

Figure 6:
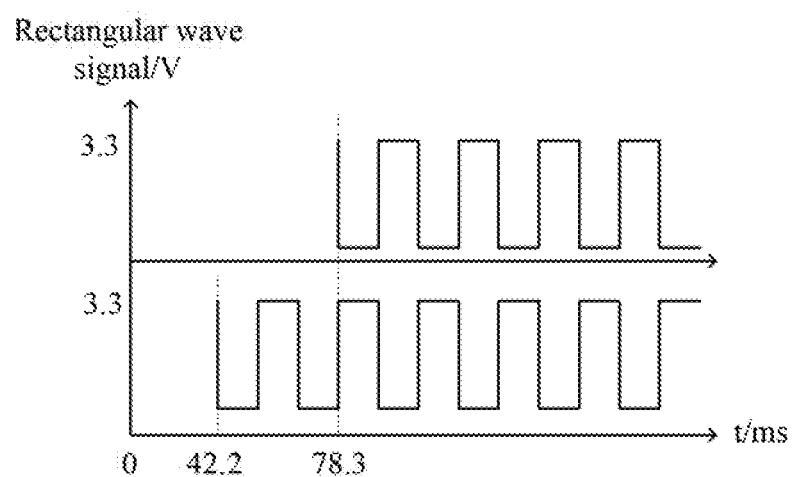
FIG. 6 illustrates a comparison waveform diagram of the tart-up time of an existing crystal oscillator circuit and the start-uptime of an exemplary crystal oscillator circuit consistent with the disclosed embodiments.

FIG. 6 illustrates a comparison waveform diagram of the start-up time of the existing crystal oscillator circuit and the start-up time of the exemplary crystal oscillator circuit consistent with the disclosed embodiments. As shown in FIG. 6, the start-tip time of the existing crystal oscillator circuit may be 78.3 ms. While in contrast, the start-up time of the exemplary crystal oscillator circuit consistent with the disclosed embodiments may be 42.2 ms, effectively reducing the start-up time of the crystal oscillator circuit.

Accordingly, on the basis of the existing crystal oscillator circuit driven by the first current source, the second current source may be added. The second current source may be configured to output the second current and be in parallel with the first current source to jointly drive the oscillator start-up circuit, such that the ability to drive the oscillator start-up circuit may be increased without changing the loop-gain of the crystal oscillator circuit, so as to decrease the start-up time of the crystal oscillator circuit. Further, the crystal oscillator circuit consistent with the disclosed embodiments may also include the pulse generation circuit. The pulse generation circuit may be configured to generate the control pulse signal, to control the second current source to output the second current after power on and to stop outputting the second current after the preset time. The second current source may only operate for the preset time when the crystal oscillator circuit consistent with the disclosed embodiments is turned on, to reduce the start-up time of circuit, at the same time, to ensure the low-power consumption characteristic of the circuit.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to 10 those persons of ordinary skill in the art. Any equivalent or modification thereof, without departing from the spirit and principle of the present invention, falls within the true scope of the present invention.

What is claimed is:

1. A crystal oscillator circuit, comprising:
   an oscillator start-up circuit having a first output terminal and a second output terminal, wherein the second output terminal outputs a first oscillation signal;
   a waveform conversion circuit configured to convert the first oscillation signal to a rectangular wave signal;
   a first current source configured to output a first current to drive the oscillator start-up circuit;
   a second current source configured to output a second current, and being connected in parallel with the first current source to jointly drive the oscillator start-up circuit; and
   a pulse generation circuit configured to generate a control pulse signal to control the second current source to output the second current after power on when the control pulse signal is at a low level and to stop outputting the second current after a preset time when the control pulse signal is at a high level.

2. The crystal oscillator circuit according to claim 1, wherein the oscillator start-up circuit includes:
   a crystal oscillator, wherein a first output terminal and a second output terminal of the crystal oscillator are respectively connected to the first output terminal and the second output terminal of the oscillator start-up circuit;
   a first load capacitor, wherein a first terminal of the first load capacitor is connected to the first output terminal of the oscillator start-up circuit, and a second terminal of the first load capacitor is grounded;
   a second load capacitor, wherein a first terminal of the second load capacitor is connected to the second output terminal of the oscillator start-up circuit, and a second terminal of the second load capacitor is grounded; and
   an inverter, wherein an input terminal and an output terminal of the inverter are respectively connected to the first output terminal and the second output terminal of the oscillator start-up circuit.

3. The crystal oscillator circuit according to claim 1, wherein the pulse generation circuit includes:
   a charging circuit having a charging node, wherein, when the power is turned on, a power supply charges the charging circuit, and the charging node outputs a first pulse signal;
   an edge adjustment circuit configured to improve the edge sharpness of the first pulse signal to obtain a second pulse signal;
   a delay circuit configured to delay the second pulse signal to output a third pulse signal; and
   a logic circuit configured to perform a logic operation onto the second pulse signal and the third pulse signal to output the control pulse signal.

4. The crystal oscillator circuit according to claim 3, wherein the charging circuit includes:
   a first resistor; and
   a third capacitor,
   wherein a first terminal of the first resistor is connected to the power supply;
   a second terminal of the first resistor is connected to a first terminal of the third capacitor and connected to the charging node; and
   a second terminal of the third capacitor is grounded.

5. The crystal oscillator circuit according to claim 3, wherein:
   the edge adjustment circuit includes a cascade of at least one buffer.

6. The crystal oscillator circuit according to claim 3, wherein:
   the delay circuit includes even number of cascaded inverters.

7. The crystal oscillator circuit according to claim 3, wherein:
   the logic circuit is an AND gate;

a first input terminal and a second input terminal of the AND gate respectively input the second pulse signal and the third pulse signal; and an output terminal of the AND gate outputs the control pulse signal.

8. The crystal oscillator circuit according to claim 2, wherein the inverter includes:
a first PMOS transistor; and
a first NMOS transistor,
wherein a gate of the first PMOS transistor is connected to a gate of the first NMOS transistor and connected to the input terminal of the inverter;
a drain of the first PMOS transistor is connected to a drain of the first NMOS transistor and connected to the output terminal of the inverter;
a source of the first NMOS transistor is grounded; and
a source of the first PMOS transistor is connected to an output terminal of the first current source and the second current source.

9. A crystal oscillator circuit, comprising:
an oscillator start-up circuit having a first output terminal and a second output terminal, wherein the second output terminal outputs a first oscillation signal;
a waveform conversion circuit configured to convert the first oscillation signal to a rectangular wave signal;
a first current source configured to output a first current to drive the oscillator start-up circuit;
a second current source configured to output a second current, and being connected in parallel with the first current source to jointly drive the oscillator start-up circuit; and
a pulse generation circuit configured to generate a control pulse signal to control the second current source to output the second current after power on and to stop outputting the second current after a preset time, wherein the second current source includes:
a second PMOS transistor;
a source of the second PMOS transistor is connected to the power supply;
a gate of the second PMOS transistor inputs the control pulse signal; and
a drain of the second PMOS transistor is as the output terminal of the second current source.

10. The crystal oscillator circuit according to claim 1, wherein:
the waveform conversion circuit includes a cascade of at least one buffer.

11. A method for driving a crystal oscillator circuit, comprising:
providing an oscillator start-up circuit having a first output terminal and a second output terminal;
providing a first current source configured to output a first current;
providing a second current source configured to output a second current; and
providing a pulse generation circuit configured to generate a control pulse signal to control the second current source to output the second current after power on when the control pulse signal is at a low level and to stop outputting the second current after a preset time when the control pulse signal is at a high level, wherein the control pulse signal is a square pulse signal.

12. The method according to claim 11, wherein:
the second current source is in parallel with the first current source to jointly drive the oscillator start-up circuit, to increase the ability to drive the oscillator start-up circuit without changing the loop-gain of the crystal oscillator circuit and to decrease the start-up time of the crystal oscillator circuit.

13. The method according to claim 11, wherein:
the second current source only operates for the preset time when the crystal oscillator circuit is turned on, to reduce the start-up time of circuit, at the same time, to ensure the low-power consumption characteristic of the circuit.

14. The method according to claim 11, wherein forming the pulse generation circuit includes:
providing a charging circuit having a charging node, wherein, when the power is turned on, a power supply charges the charging circuit, and the charging node outputs a first pulse signal;
providing an edge adjustment circuit configured to improve the edge sharpness of the first pulse signal to obtain a second pulse signal;
providing a delay circuit configured to delay the second pulse signal to output a third pulse signal; and
providing a logic circuit configured to perform a logic operation onto the second pulse signal and the third pulse signal to output the control pulse signal.

15. The method according to claim 14, wherein forming the charging circuit includes:
providing a first resistor; and
providing a third capacitor,
wherein a first terminal of the first resistor is connected to the power supply;
a second terminal of the first resistor is connected to a first terminal of the third capacitor and connected to the charging node; and
a second terminal of the third capacitor is grounded.

16. The method according to claim 14, wherein:
the edge adjustment circuit includes a cascade of at least one buffer.

17. The method according to claim 14, wherein:
the delay circuit includes even number of cascaded inverters.

18. The method according to claim 14, wherein:
the logic circuit is an AND gate;
a first input terminal and a second input terminal of the AND gate respectively input the second pulse signal and the third pulse signal; and
an output terminal of the AND gate outputs the control pulse signal.

19. The method according to claim 11, wherein forming the second current source includes:
providing a second PMOS transistor;
a source of the second PMOS transistor is connected to the power supply;
a gate of the second PMOS transistor inputs the control pulse signal; and
a drain of the second PMOS transistor is as the output terminal of the second current source.

* * * * *